(12) United States Patent
Koizumi et al.

(10) Patent No.: US 6,863,018 B2
(45) Date of Patent: Mar. 8, 2005

(54) ION PLATING DEVICE AND ION PLATING METHOD

(75) Inventors: Yasuhiro Koizumi, Hyogo (JP); Kouichi Nose, Hyogo (JP); Isao Tokomoto, Hyogo (JP)

(73) Assignee: Shinmaywa Industries, Ltd., Hyogo (JP)

( * ) Notice: Subject to any disclaimer, the term of this patent is extended or adjusted under 35 U.S.C. 154(b) by 0 days.

(21) Appl. No.: 09/812,668

(22) Filed: Mar. 20, 2001

(65) Prior Publication Data
US 2001/0023822 A1 Sep. 27, 2001

(30) Foreign Application Priority Data
Mar. 21, 2000 (JP) ........................................ 2000-078952

(51) Int. Cl.[7] ........................... C23C 16/00; H05H 1/00; H01G 37/317
(52) U.S. Cl. ............................. 118/723 E; 156/345.43; 250/492.3
(58) Field of Search ............................ 118/723 E, 728, 118/723 ER, 723 FE; 156/345.43, 345.44, 345.51; 250/493.3, 492.21, 492.31

(56) References Cited

U.S. PATENT DOCUMENTS

| 4,039,416 A | * | 8/1977 | White .......................... 427/523 |
| 4,464,223 A | * | 8/1984 | Gorin .......................... 438/729 |
| 5,290,993 A | * | 3/1994 | Kaji et al. .............. 219/121.43 |
| 5,435,886 A | * | 7/1995 | Fujiwara et al. ............. 438/710 |
| 5,654,043 A | * | 8/1997 | Shao et al. ................... 427/527 |
| 5,777,438 A | * | 7/1998 | Suzuki .................... 315/111.81 |
| 5,906,684 A | * | 5/1999 | Tamura et al. ............... 118/728 |
| 6,033,587 A | * | 3/2000 | Martin et al. .................. 216/71 |
| 6,051,114 A | * | 4/2000 | Yao et al. ................. 204/192.3 |
| 6,074,488 A | * | 6/2000 | Roderick et al. ............ 118/728 |
| 6,201,208 B1 | * | 3/2001 | Wendt et al. ........... 219/121.41 |
| 6,218,196 B1 | * | 4/2001 | Ise et al. ...................... 438/689 |
| 6,231,777 B1 | * | 5/2001 | Kofuji et al. ................... 216/71 |
| 6,264,788 B1 | * | 7/2001 | Tomoyasu et al. ...... 156/345.43 |

FOREIGN PATENT DOCUMENTS

| JP | 56-81678 A | * | 7/1981 | .............. C23F/1/00 |
| JP | 58-100672 A | * | 6/1983 | ........... C23C/13/00 |
| JP | 10-4085 A | * | 1/1998 | ....... H01L/21/3065 |
| JP | 11224796 A | * | 8/1999 | ............. H05H/1/46 |

* cited by examiner

Primary Examiner—Parviz Hassanzadeh
(74) Attorney, Agent, or Firm—Marshall, Gerstein & Borun LLP

(57) ABSTRACT

In ion plating in which a substrate is held on a substrate holder placed in an evacuated vacuum chamber and plasma is generated in the vacuum chamber to be formed into a film, a bias voltage composed of a negative bias component having a predetermined negative voltage value for a predetermined output time and a pulse bias component corresponding to a pulse output having a constant positive value for a predetermined time and output with a cycle set in the rage of 1 kHz–1 GHz is supplied to the inside of the vacuum chamber through the substrate holder by a power supply unit.

15 Claims, 4 Drawing Sheets

ION PLATING DEVICE AND ION PLATING METHOD

BACKGROUND OF THE INVENTION

1. Field of the Invention

The present invention relates to an ion plating device and an ion plating method.

2. Description of the Related Art

Film formation by Ion plating is performed by supplying a constant voltage to the inside of a vacuum chamber to generate a discharge plasma from a material of a film and by applying the plasma to a substrate placed in the vacuum chamber to deposit the film on the substrate.

Such film formation by ion plating is employed in film formation on various types of substrates, such as coating of a reflection film on a mirror. FIG. 4 is a schematic view showing a structure of an example of a device for forming a film by the ion plating.

Referring to FIG. 4, an ion plating device 60 comprises a vacuum chamber 61, a substrate holder 62 placed in the vacuum chamber 61 for holding the substrate 65, a vaporizing source 63 for holding a material of a film and vaporizing the material in the vacuum chamber 61, a radio frequency (RF) power supply 66 for supplying predetermined power to the inside of the vacuum chamber 61 via the substrate holder 62, and a direct current (DC) power supply 67 for supplying a constant negative bias voltage to the inside of the vacuum chamber 61 via the substrate holder 62.

The material vaporized by the vaporizing source 63 is changed into a plasma 68 by power supplied by the RF power supply 66 and the DC power supply 67 and an ionized material contained in the plasma 68 is deposited on the substrate 65 as the film, thus forming the film on the substrate 65.

By application of the bias voltage by the DC power supply 67, the ions tends to acceleratively migrate toward the substrate 65 and the film can be made dense. Also, by application of the bias voltage, a film strongly adhered to the substrate 65 can be formed. Particularly when the voltage output from the DC power supply 67 is higher, it is possible to make the film denser and more strongly adhered to the substrate 65.

However, it is proved that arcing is likely to occur in the vacuum chamber 61 when the bias voltage is applied as described above. In addition, it is proved that the arcing is more likely to occur especially when the bias voltage is higher. It is considered that the arcing occurs as follows.

When the bias voltage is applied, the ions in the plasma 68 tend to be drawn toward the substrate holder 62 and be spatially biased. When the substrate 65 situated between the vaporizing source 63 and the substrate holder 62 or the film formed on the substrate 65 is made of an insulating material, or the material of the film is the insulating material, the ions are captured by the insulating material, and its vicinity is not electrically neutralized, causing a large electric field to be locally formed. For this reason, breakdown of the insulating material occurs, causing arcing.

Particularly when the substrate 65 or the film on the substrate 65 is made of the insulating material, the ions tend to be captured in the vicinity of the substrate 65 or on the film, which causes the arcing to occur in the vicinity of the substrate 65 or on the film. When the arcing occurs, impurities tends to be mixed into the film in formation of the film on the substrate 65, causing uniformity or density of the film to be reduced. When a path of the arcing penetrates through the film formed on the substrate 65, the film is damaged.

SUMMARY OF THE INVENTION

The present invention has been developed for obviating the above-described problems, and an object of the present invention is to provide an ion plating device and an ion plating method, which prevent occurrence of arcing when using a bias voltage to improve density and adhesion of a film and thereby prevent impurities from being mixed into the film to avoid damage to a substrate and the film.

To achieve the above-described object, there is provided an ion plating device comprising: a vacuum chamber adapted to be evacuated; substrate holder placed in the vacuum chamber for holding a substrate; and a power supply unit for supplying power used for changing a material of a film to be formed on the substrate into a plasma and depositing the film from the plasma on the substrate to an inside of the vacuum chamber through the substrate holder, wherein the power supply unit includes a bias power supply unit for outputting a bias voltage composed of a negative bias component having a predetermined negative voltage value for a predetermined output time and a pulse bias component corresponding to a pulse output having a positive voltage value for a predetermined time, with a cycle set in a range of 1 kHz to 1 GHz.

In the ion plating device, the negative bias of the bias voltage enables the ions in the plasma to acceleratively migrate toward the substrate. Therefore, a dense and strongly adhesive film can be formed on the substrate. In addition to this, when the substrate or the film formed on the substrate is made of an insulating material, or a material of the film mixed in the plasma is an insulating material, the pulse bias component of the bias voltage allows positive charges captured in the insulating material to be neutralized. Thereby, mixing of impurities into the film formed on the substrate and damages such as pin holes in the film can be prevented.

It is preferable that a ratio of the predetermined time of the pulse bias to the cycle of the bias is 40% or less. This is because if the time of the pulse bias in one cycle of the bias voltage is relatively long, plasma might be attenuated and efficiency of film formation is reduced.

In the ion plating device, as the pulse output of the pulse bias, a square wave pulse having a pulse width for the predetermined time and having a predetermined voltage value may be used. Using such a square wave pulse, a desired pulse bias of the bias voltage is easily obtained and a pulse bias having a desired voltage value and a pulse width for neutralization of the positive charges in the vicinity of the substrate is easily given.

It is preferable that the bias power supply unit comprises a waveform generator for generating a basic waveform of the bias voltage and a bias power supply for generating the bias voltage having a constant value based on the basic waveform output from the waveform generator. Since the bias voltage having a predetermined waveform can be formed by using the waveform generator capable of generating an arbitrary waveform, a desired bias voltage is easily obtained.

It is preferable that the bias power supply unit comprises a direct current power supply for forming the negative bias and a pulse power supply for forming the pulse bias. Since the direct current power supply and the pulse power supply can be independently adjusted, the negative bias component and the pulse bias component can be independently adjusted. Consequently, the bias voltage can be easily adjusted.

When the bias power supply unit of the ion plating device comprises the waveform generator and the bias power supply, the device may further comprise: a radio frequency power supply unit for outputting radio frequency power; a high pass filter provided between the radio frequency power supply unit and the substrate holder for passing an output of the radio frequency power supply unit therethrough toward the substrate holder and preventing an output of the bias power supply unit from being input to the radio frequency power supply unit; and a first low pass filter provided between the bias power supply unit and the substrate holder for passing an output of the bias power supply unit therethrough toward the substrate holder and preventing an output of the radio frequency power supply unit from being input to the bias power supply unit.

The radio frequency power supply unit, as well as the bias power supply unit, is capable of supplying power required for film formation when the plasma is generated to form the film. Thereby, desired power can be supplied by a relatively simple method and a total cost can be reduced because of improved yield associated with the film formation, including maintenance and operation of the device.

When the bias power supply unit of the ion plating device comprises the direct current power supply and the pulse power supply, the device may further comprise: a radio frequency power supply unit for outputting radio frequency power; a high pass filter provided between the radio frequency power supply unit and the substrate holder for passing an output of the radio frequency power supply unit therethrough toward the substrate holder and preventing an output of the bias power supply unit from being input to the radio frequency power supply unit; and a first low pass filter provided between the bias power supply unit and the substrate holder for passing an output of the bias power supply unit therethrough toward the substrate holder and preventing an output of the radio frequency power supply unit from being input to the bias power supply unit. Also in this case, the radio frequency power supply unit, as well as the bias power supply unit, is capable of supplying power required for film formation. Thereby, desired power can be supplied by a relatively simple method and a total cost can be reduced because of improved yield associated with the film formation, including maintenance and operation of the device.

When the bias supply unit of the ion plating device comprises a direct current supply for forming the negative bias and an impulse train power supply for forming the pulse bias, the device may further comprise a second low pass filter provided between the direct current power supply and the substrate holder, for passing an output of the direct current power supply therethrough toward the substrate holder and preventing an output of the impulse train power supply from being input to the direct current power supply; and a band pass filter provided between the impulse train power supply and the substrate holder, for passing an output of the impulse train power supply therethrough toward the substrate holder and preventing an output of the direct current power supply from being input to the impulse train power supply. With this configuration, the direct current power supply for forming the negative bias and the impulse train power supply for forming the pulse bias can be independently adjusted and the bias voltage can be adjusted more easily.

This ion plating device may further comprise a radio frequency power supply unit for outputting radio frequency power; and a high pass filter provided between the radio frequency power supply unit and the substrate holder for passing an output of the radio frequency power supply unit therethrough toward the substrate holder and preventing an output of the bias power supply unit from being input to the radio frequency power supply unit, wherein the second low pass filter is adapted to further prevent an output of the radio frequency power supply unit from being input to the direct current power supply, and the band pass filter is adapted to further prevent an output of the radio frequency power supply unit from being input to the impulse train power supply. In this device, independent adjustment of the negative bias and the pulse bias of the bias voltage can be easily performed, that is, parameters for film formation cam be adjusted independently of one another. In addition, desired power can be adjusted by a relatively simple method.

There is also provided an ion plating device comprising: a vacuum chamber adapted to be evacuated; a substrate holder placed in the vacuum chamber for holding a substrate; and a power supply unit for supplying power used for changing a material of a film to be formed on the substrate into a plasma and depositing the film from the plasma on the substrate to an inside of the vacuum chamber through the substrate holder, wherein the power supply unit is adapted to output a bias voltage composed of a negative bias component having a predetermined negative voltage value for a predetermined output time and a pulse bias component corresponding to a pulse output having a positive voltage value for a predetermined time, with a cycle set in a range of 1 kHz to 1 GHz, and output radio frequency power, further comprising: a function generator for synthesizing a waveform corresponding to the negative bias component of the bias voltage, a waveform corresponding to the pulse bias component of the bias voltage, and a waveform corresponding to radio frequency of the radio frequency power; and a linear amplifier for amplifying the waveform synthesized by the function generator and supplying an amplified waveform. Thereby, filters and hence adjustment of the filters become unnecessary. Also, the output of the bias voltage composed of the negative bias and the pulse bias and the output of radio frequency can be unitarily managed. Consequently, adjustment for well-balanced outputs becomes easy.

In the ion plating device in which the power supply unit is adapted to output radio frequency power, a preliminary plasma forming process is adapted to be carried out in such a manner that the vacuum chamber is evacuated to $6.7 \times 10^{-3}$ Pa to $6.7 \times 10^{-1}$ Pa and a bias voltage composed of a negative bias component having a predetermined negative voltage value for a predetermined output time and a pulse bias component corresponding to a pulse output having a positive voltage value for a predetermined time, the pulse bias component having an absolute value smaller than an absolute value of the negative bias component, is output with a cycle set in a range of 1 kHz to 1 GHz to generate a preliminary plasma and then, a film forming process is adapted to be carried out in such a manner that the vacuum chamber is evacuated to a state in which the material of the film can be vaporized to generate a plasma for film formation and the radio frequency power as well as the bias voltage is output to generate the plasma for film formation, thereby forming the film on the substrate.

In the ion plating device in which the power supply unit outputs radio frequency power, and a process for generating the preliminary plasma is first performed and a process for forming the plasma for film formation is then performed, the cycle of the bias voltage applied together with the radio frequency power is set between 10 kHz and 500 kHz in the process for forming the film on the substrate.

In the device without the radio frequency power supply unit, a preliminary plasma forming process is adapted to be carried out in such a manner that the vacuum chamber is evacuated to $6.7\times10^{-3}$ Pa to $6.7\times10^{-1}$ Pa and a bias voltage composed of a negative bias component having a predetermined negative voltage value for a predetermined output time and a pulse bias component corresponding to a pulse output having a positive voltage value for a predetermined time, the pulse bias component having an absolute value smaller than an absolute value of the negative bias component, is output with a cycle set in a range of 1 kHz to 1 GHz to generate a preliminary plasma, and then a film forming process is adapted to be carried out in such a manner that the vacuum chamber is evacuated to a state in which the material of the film can be vaporized to generate a plasma for film formation and the bias voltage is output with a cycle set in a range of 1 MHz to 1 GHz to generate the plasma for film formation, thereby forming the film on the substrate.

There is provided an ion plating method in which a vacuum chamber in which a substrate holder for holding a substrate and a vaporizing source for holding a material of a film to be formed on the substrate are placed is evacuated to a vacuum state and predetermined power is supplied to an inside of the vacuum chamber through the substrate holder to generate a plasma from which the film is formed on the substrate, comprising the steps of: evacuating the vacuum chamber to a state of $6.7\times10^{-3}$ Pa to $6.7\times10^{-1}$ Pa and applying a bias voltage composed of a negative bias component having a predetermined negative voltage value for a predetermined output time and a pulse bias component corresponding to a pulse output having a positive voltage value for a predetermined time, the pulse bias component having an absolute value smaller than an absolute value of the negative bias component, with a cycle set in a range of 1 kHz to 1 GHz, to generate a preliminary plasma; and evacuating the vacuum chamber to a state in which the material of the film can be vaporized to generate a plasma for film formation and applying the radio frequency power as well as the bias voltage to generate the plasma for film formation.

In this method, the cycle of the bias voltage in the step of generating the plasma for film formation is set between 10 kHz and 500 kHz.

Also in this method, in the step of generating the plasma for film formation after the step of generating the preliminary plasma, the bias voltage is applied with a cycle set in a range of 1 MHz to 1 GHz.

These objects as well as other objects, features and advantages of the invention will become more apparent to those skilled in the art from the following description with reference to the accompanying drawings.

DETAILED DESCRIPTION OF THE PREFERRED EMBODIMENTS

Hereinafter, an embodiment of the present invention will be described with reference to FIGS. 1 through 3.

Figure 1A:
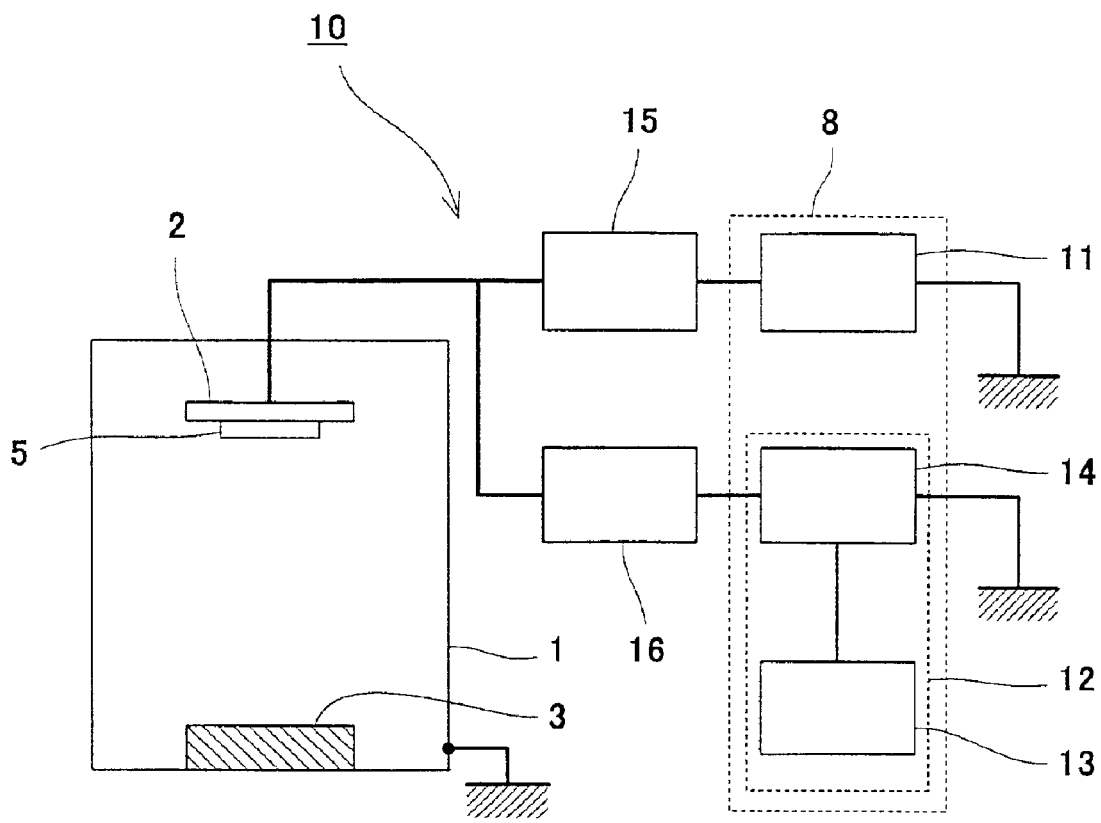
FIG. 1A is a schematic view showing a configuration of an ion plating device according to an embodiment of the present invention and FIG. 1B is a view showing an example of a bias voltage according to the embodiment of the present invention.

FIG. 1A is a schematic view showing a configuration of an ion plating device 10 according to an embodiment of the present invention. Referring now to FIG. 1A, the device 10 comprises a vacuum chamber 1 and a power supply unit 8. The power supply unit 8 comprises a radio frequency (RF) power supply unit 11 and a bias power supply unit 12.

A substrate holder 2 is placed in an upper portion of the vacuum chamber 1 for holding a substrate 5 on which a film is to be formed. The substrate holder 2 is made of a conductive material and electric power is supplied from the RF power supply unit 11 and the bias power supply unit 12 to the inside of the vacuum chamber 1 through the substrate holder 2. The substrate holder 2 is adapted to be rotatably driven by a motor (not shown). The film is formed while the substrate holder 2 is rotated.

A vaporizing source 3 is placed in a lower portion of the chamber 1 for holding a material to be formed into the film and vaporizing the material in a space inside of the chamber 1. As the vaporizing source 3, various types of vaporizing sources capable of vaporizing the material of the film in the space inside of the chamber 1 may be employed, including a vaporizing source that vaporizes the material of the film by resistance heating by using a heating power supply, a vaporizing source that heats and vaporizes the material by using an electron gun, a vaporizing source that vaporizes the material by sputtering, a vaporizing source that vaporizes the material by the arcing, and so forth.

The vacuum chamber 1 can be evacuated to a desired vacuum state by using an evacuation means such as a vacuum pump and a gas supply means (not shown). Specifically, free adjustment can be performed as necessary to obtain the desired vacuum state by setting a desired vacuum at which a preliminary plasma is generated by using a given gas in a previous stage or setting a desired vacuum at which the material of the film is changed into a plasma for film formation, according to respective processes in a series of steps for film formation.

The vacuum chamber 1 is made of a conductive material and a wall thereof is electrically grounded.

The RF power supply unit 11 is capable of supplying radio frequency power to the inside of the vacuum chamber 1 and changing the material of the film vaporized by the vaporizing source 3 into the plasma. The RF power supply unit 11 has an output terminal connected to the substrate holder 2 through a high pass filter 15 and an output terminal electrically grounded. RF power output from the RF power unit 11 is applied to the substrate holder 2.

A high pass filter 15 is provided between the RF power supply unit 11 and the substrate holder 2 for passing an output of the RF power supply unit 11 therethrough toward the substrate holder 2 and preventing an output of the bias power supply unit 12 from being input to the RF power supply unit 11.

As for a power value or a frequency of the output of the RF power supply unit 11, a desired power value or frequency is selected according to film forming conditions such as the type of the material of the film to be formed.

The bias power supply unit 12 comprises a wave generator 13 and a bias power supply 14. The wave generator 13 serves to generate a waveform of a bias voltage to be output from the bias power supply unit 12. The waveform generator 13 is capable of generating a direct current (DC) component stationarily having a constant value, an alternating current (AC) component of each frequency, or various types of waveforms such as a square wave or a triangular wave, as a basic component. Also, the waveform generator 13 is capable of synthesizing a plurality of basic components into a basic waveform. The bias power supply 14 serves to amplify the basic waveform generated by the waveform generator 13 into a bias voltage having a predetermined value.

The bias power supply 14 has an output terminal connected to the substrate holder 2 through a low pass filter 16 and an output terminal electrically grounded. The bias voltage output from the bias power supply 14 is applied to the substrate holder 2 and a bias is thereby supplied to the inside of the vacuum chamber 1.

The low pass filter 16 is provided between the bias power supply 14 and the substrate holder 2 for passing an output of the bias power supply 14 therethrough toward the substrate holder 2 and preventing an output of the RF power supply unit 11 from being input to the bias power supply unit 12. The low pass filter 16 corresponds to a first low pass filter.

Figure 1B:
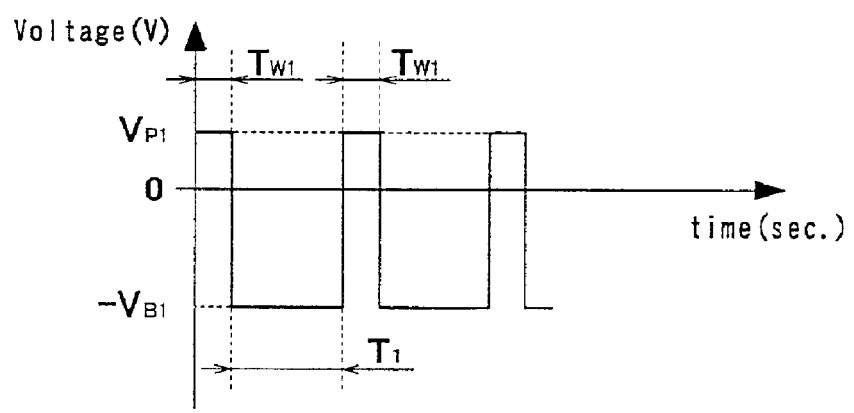

Subsequently, the bias voltage output from the bias power supply unit 12 will be explained. FIG. 1B shows an example of the waveform of the bias voltage. In FIG. 1B, a lateral axis indicates time(sec.) and a longitudinal axis indicates voltage values (V). An area above the lateral axis indicates positive voltages and an area below the lateral axis indicates negative voltages.

The bias voltage is, as shown in FIG. 1B, composed of a negative bias component corresponding to a DC voltage having a constant negative voltage value ($-V_{B1}$) for a predetermined time $T_1$ and a pulse bias component corresponding to a square wave pulse having a constant positive voltage value ($V_{p1}$) for a predetermined time ($T_{w1}$).

In formation of the film, in order to obtain a film having a desired density and desired adhesion to the substrate, the voltage value ($-V_{B1}$) and the output time ($T_1$) of the negative bias component are selected so as to give acceleration to the ions in the plasma by application of the negative bias. The voltage value ($-V_{B1}$) is set in the range of $-2000V$ to $0V$.

The voltage value ($V_{p1}$) and the pulse width ($T_{w1}$) of the pulse bias component are selected, which are sufficient to neutralize positive charges accumulated in the material in the substrate 5, the film formed on the substrate 5, or the plasma, and do not attenuate the plasma. The voltage value ($V_{p1}$) is set in the range of $0V$ to $2000V$.

In the example shown in FIG. 1B, the ratio of the output time of the positive pulse width ($T_{w1}$) to a cycle of the bias voltage, i.e., ($T_{w1}/(T_{w1}+T_1)$) is 40% and the ratio of the output time ($T_1$) of the negative bias to the cycle, i.e., ($T_1/(T_{w1}+T_1)$) is 60%. It is preferable that the ratio of the pulse width $T_{w1}$ to the cycle of the bias voltage is 40% or less. This is because when the ratio is larger than 40%, the plasma might be attenuated, which results in reduced efficiency of film formation.

Figure 2:
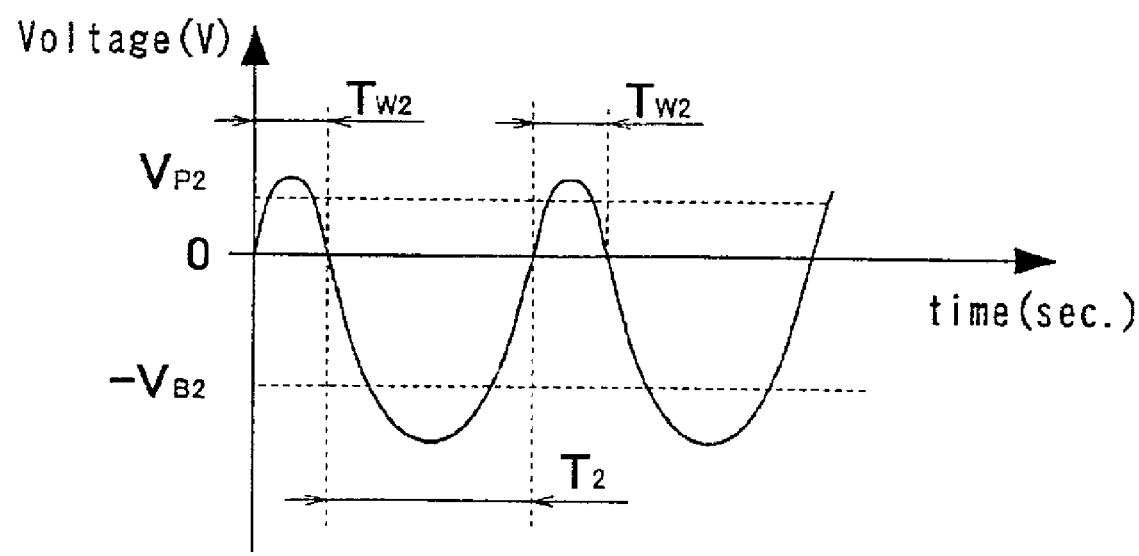
FIG. 2 is a view showing another example of the bias voltage according to the embodiment of the present invention.

FIG. 2 shows an example of another waveform of the bias voltage. The waveform of FIG. 2 is also composed of a negative bias component having a negative voltage value ($-V_{B2}$) for a predetermined time ($T_2$) and a component having a positive voltage value ($V_{p2}$) for a predetermined time ($T_{w2}$). The bias voltage of FIG. 2 is obtained by adding a DC voltage having a constant negative voltage value to an AC voltage.

The voltage value ($-V_{B2}$) and output time ($T_2$) are selected to provide a film having a desired density and desired adhesion to the substrate (a voltage value (absolute value) $V_{B2}$ is an average value for time $T_2$).

The voltage value ($V_{p2}$) and time ($T_{w2}$) of the positive component are selected, which are sufficient to neutralize positive charges accumulated in or in the vicinity of the substrate 5 and do not attenuate the plasma in the chamber 1 (A voltage value $V_{p2}$ is an average value for time $T_{w2}$).

The absolute values $V_{B2}$, $V_{p2}$ are set in the range of $0V$ to $2000V$.

Preferably, the repeated cycle of the bias voltage of FIG. 2 is set between 1 kHz and 1 GHz. Below 1 kHz, because the frequency at which the pulse bias is applied is low, an electric field causing breakdown is formed before the charges of the ions captured in the vicinity of the substrate 5 are neutralized, while above 1 GHz, adjustment of timing at which the pulse bias is to be applied becomes difficult.

More preferably, the cycle of the bias voltage is set between 10 kHz and 500 kHz.

In the ion plating device 10 described above, since the film can be formed on the substrate 5 by accelerating the ions in the plasma as a result of application of the negative voltage having the predetermined negative value, it is possible to form a dense and strongly adhesive film. In addition to this, the application of the pulse bias having the positive voltage value allows the positive charges captured in the insulating material to be neutralized when there is a material comprising the insulating material on the substrate 5 and its vicinities such as the film formed on the substrate 5. Thereby, occurrence of the arcing can be prevented. Therefore, mixing of the impurities into the film formed on the substrate 5 can be prevented, and an uneven structure of the film can be avoided. Also, damage to the film, the substrate or the like can be avoided.

Subsequently, another example of the power supply unit will be described with reference to FIGS. 3A and 3B. A bias power supply unit 22 of FIG. 3A comprises a DC power supply 24 for outputting a constant negative DC voltage to form a negative bias, and a pulse power supply 23 for outputting a constant positive pulse voltage to form a pulse bias. The output of the DC power supply 24 and the output of the pulse power supply 23 form the bias voltage. The bias voltage is output to the substrate holder 2 through a low pass filter 21.

The low pass filter 21 is adapted to pass the bias voltage output from the DC power supply 24 and the pulse power supply 23 therethrough toward the substrate 2 and prevent an output of the RF power supply unit 11 from being input to the bias power supply unit 22. The low pass filter 21 corresponds to a first low pass filter.

Figure 3A:
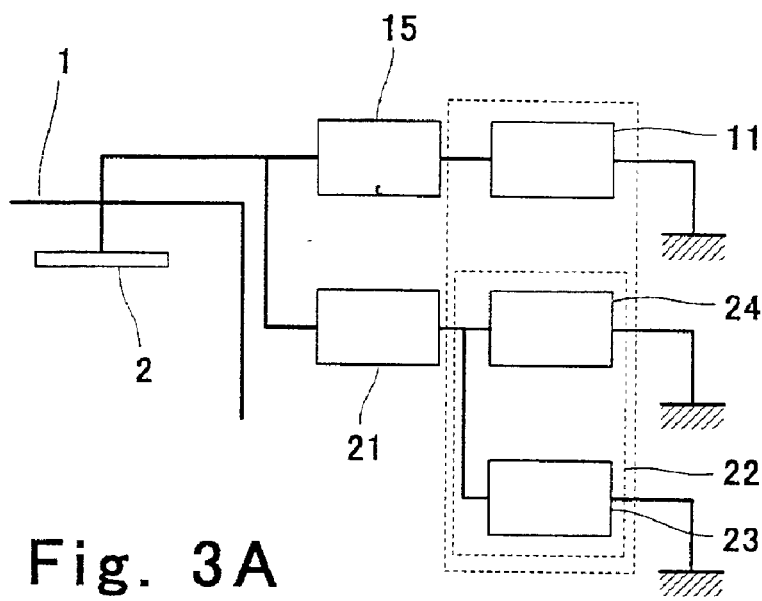
FIGS. 3A–3C are views showing configurations of a bias power supply unit according to the embodiment of the present invention.

When the bias power supply unit is configured as shown in FIG. 3A, the DC power supply unit 24 for forming the negative bias and the pulse power supply 23 for forming the pulse bias are independently provided. Therefore, the negative bias and the pulse bias are easy to independently adjust.

Figure 3B:
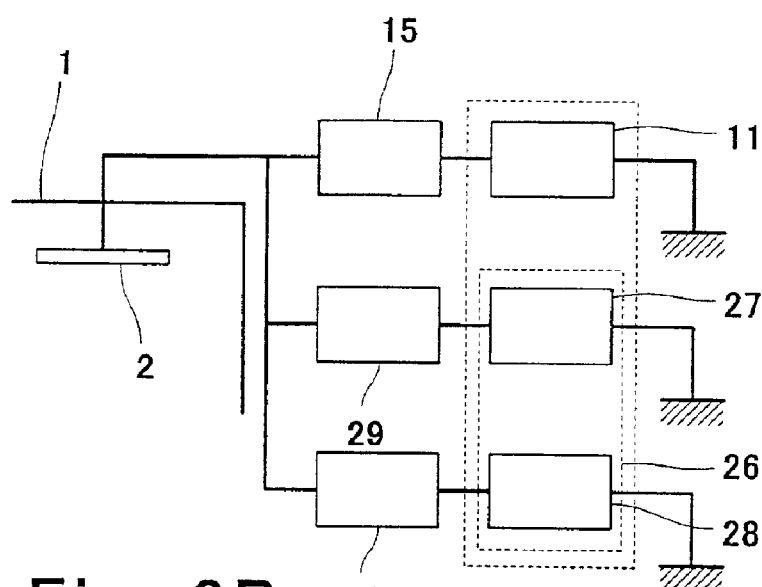

FIG. 3B shows still another example of the bias power supply unit. A bias power supply unit 26 of FIG. 3B comprises a DC power supply 27 for outputting a constant negative DC voltage to form a negative bias and an impulse train power supply 28 for forming a pulse bias. The output of the DC power supply 27 is sent to the substrate holder 2 through the low pass filter 29 and the output of the impulse train power supply 28 is sent to the substrate holder 2 through a band pass filter 30. The bias voltage formed from these outputs is applied to the substrate holder 2.

The low pass filter 29 is provided between the DC power supply 27 and the substrate holder 2 for passing the output of the DC power supply 27 therethrough toward the substrate holder 2 and preventing the output of the RF power supply unit 11 and the output of the impulse train power supply 28 from being input to the DC power supply 27. The low pass filter 29 corresponds to a second low pass filter.

The band pass filter 30 is provided between the impulse train power supply 28 and the substrate holder 2 for passing the pulse output of the impulse train power supply 28 therethrough toward the substrate holder 2 and preventing the output of the RF power supply unit 11 and the output of the DC power supply 27 from being input to the impulse train power supply 28.

In the bias power supply unit 26 of FIG. 3B, the DC power supply 27 for forming the negative bias and the impulse train power supply 28 for forming the pulse bias are independent and the filters 29, 30 associated with the outputs from these power supplies 27, 28 to the substrate holder 2 are also independent. Therefore, the bias voltage is easy to adjust.

Figure 3C:
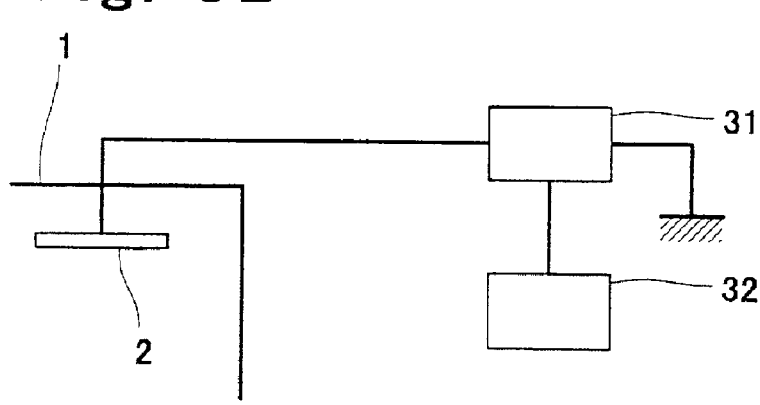
Figure 4:
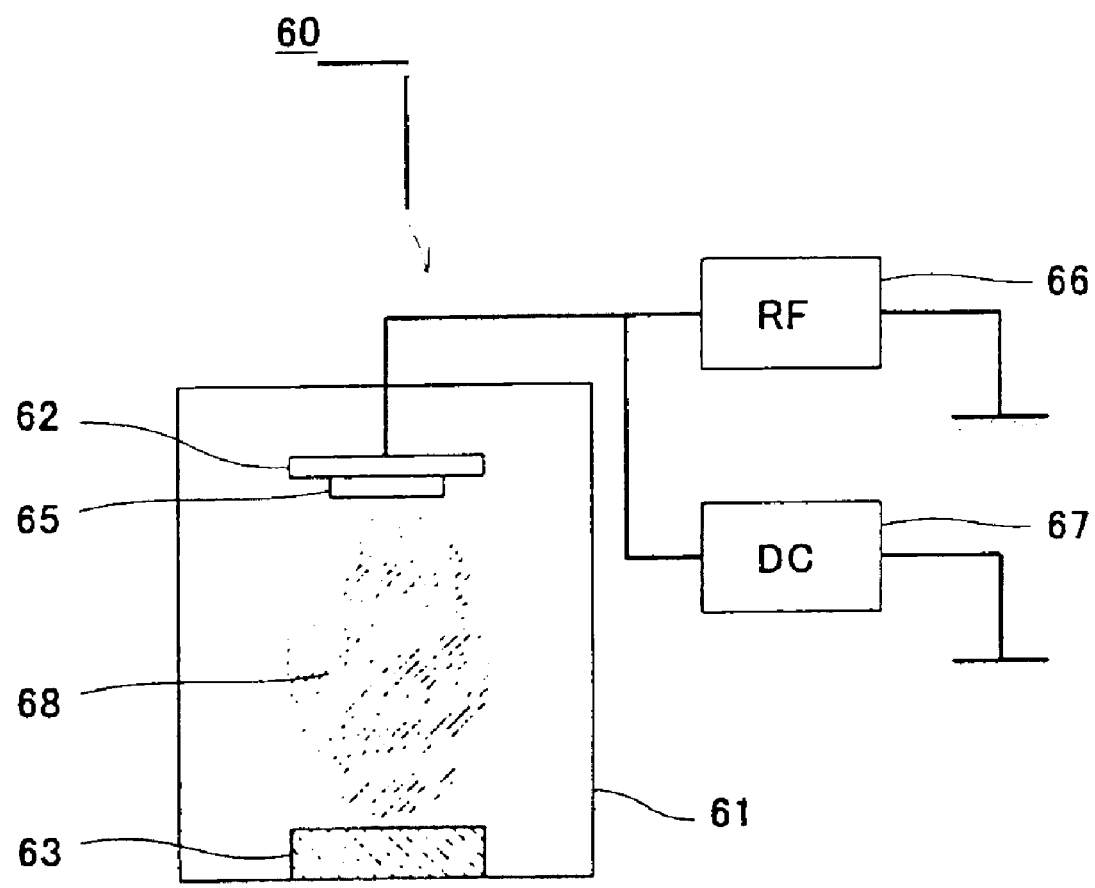
FIG. 4 is a schematic view showing a configuration of the conventional ion plating device.

FIG. 3C shows still another example of the power supply unit. In the example shown in FIG. 3C, the power supply unit is constituted by a linear amplifier 31 and a function generator 32. The function generator 32 is adapted to synthesize the RF waveform of the RF power, the waveform of the negative bias component of the bias voltage, and the waveform of the pulse bias component of the bias voltage, to generate a synthesized waveform, which is amplified by the linear amplifier 31 and output to the substrate holder 2 as a desired output.

When the power supply unit is configured as shown in FIG. 3C, adjustment of the filters becomes unnecessary because it is not necessary to provide the filters. In addition, the RF output, the output of the negative bias of the bias voltage, and the output of the pulse bias of the bias voltage can be managed unitarily and adjustment for the well-balanced outputs becomes easy.

When the negative bias component and the pulse bias component are independently output like the bias power supply units 22, 26 of FIGS. 3A, 3B, adjustment is made among the outputs of the DC power supplies 24, 27, the output of the pulse power supply 23 and the output of the impulse train power supply 28 so that the bias voltage formed by synthesizing these outputs becomes a negative bias having a predetermined voltage value and a pulse bias having a predetermined voltage value.

The above-described ion plating device is provided with a controller (not shown). Under control of the controller, the RF power supply unit 11 outputs the RF power composed of predetermined power or frequency, the bias power supply units 12, 22, 26 respectively output a predetermined negative bias or pulse bias, and the function generator 32 and the linear amplifier 31 perform desired operation. Under control of the controller, the evacuation means such as the vacuum pump and the gas supply means also operate to evacuate the chamber 1 to a desired state.

Hereinbelow, operation examples of operation of the device 10 for forming the film by using the ion plating device 10 will be described. In examples shown below, as a material to be formed into the film, magnesium fluoride ($MgF_2$), i.e., an insulating material, is used and a film made of $MgF_2$ is formed on the substrate.

[Operation 1]

$MgF_2$ is set on the vaporizing source 3 and the vacuum chamber 1 is closed. In this state, operation of the device 1 is started. In a previous stage, a process for generating a preliminary plasma is performed. As a process gas, for example, Argon (Ar) gas is introduced into the vacuum chamber 1 to evacuate the chamber 1 to a vacuum of $6.7 \times 10^{-3}$ Pa ($5 \times 10^{-5}$ Torr)–$6.7 \times 10^{-1}$ Pa ($5 \times 10^{-3}$ Torr). Among the power supplies, only the bias power supply unit 12 is operated and the bias voltage is applied to generate a discharge plasma. In this case, the bias power supply unit 12 is adapted to output the bias voltage having a positive pulse bias voltage value (absolute value) that is smaller than a negative bias voltage value (absolute value), with a cycle of 1 kHz–1 GHz.

Subsequently, a process for generating a film formation plasma is performed. The RF power supply unit 11 is operated and application of RF power is started. The RF power supply unit 12 outputs the power sufficient to generate a plasma having a desired concentration for film formation. Then, the vaporizing source 3 heats $MgF_2$ to vaporize $MgF_2$ in the chamber 1 and evacuates the chamber 1 to a desired vacuum for film formation.

Thus, first, in the process for generating the preliminary plasma, the plasma is generated by using the pulse bias, and then the film forming plasma generating process is performed. This is because, if the output of the RF power supply unit 11 is sufficient to generate the plasma required for film formation in an initial stage, arcing might occur. On the other hand, when the process for generating the preliminary plasma is first performed and then transitions to the process for generating the plasma for film formation, occurrence of the arcing can be suppressed.

In the process for generating the preliminary plasma, instead of using the pulse bias, the output of the RF power supply unit 11 and the vacuum in the vacuum chamber 1 may be set to generate the plasma which will not bring about arcing.

[Operation 2]

$MgF_2$ is set on the vaporizing source 3 and the vacuum chamber 1 is closed. In this state, operation of the device 10 is started. Initially, a process for generating a preliminary plasma is performed. As a process gas, for example, argon (Ar) gas is introduced into the vacuum chamber 1 to evacuate the camber 1 to a vacuum of $6.7 \times 10^{-3}$ Pa ($5 \times 10^{-5}$ Torr)–$6.7 \times 10^{-1}$ Pa ($5 \times 10^{-3}$ Torr). Among the power supplies, only the bias power supply unit 12 is operated and the bias voltage is applied to generate a discharge plasma. The bias power supply unit 12 is adapted to output the bias voltage having a pulse bias voltage value (absolute value) smaller than a negative bias voltage value (absolute value), with a cycle of 1 kHz–1 GHz.

Subsequently, a process for generating a plasma for film formation is performed. The bias power supply unit 12 outputs the voltage with a cycle of 1 MHz–1 GHz. Then, the vaporizing source 3 heats $MgF_2$ to vaporize $MgF_2$ in the chamber 1, and the chamber 1 is evacuated to a desired vacuum state required for film formation.

Like this example, only the bias power supply unit 12 may be used for film formation without operating the RF power supply unit 11.

The ion plating device 10 described above may employ various types of ion plating methods such as: a method using an inert gas such as Ar, an ion plating method without using the inert gas, and an ion plating method using a reactive gas.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

What is claimed is:

1. An ion plating device comprising:
   a vacuum chamber adapted to be evacuated;
   a substrate holder placed in the vacuum chamber for holding a substrate;
   a vaporizing source for vaporizing a film forming material to be formed on the substrate within the vacuum chamber;
   a power supply unit including an RF power unit connected to the substrate holder for supplying RF power to an inside of the vacuum chamber through the substrate holder for changing the vaporized film forming material into a plasma and for depositing the film forming material from the plasma on the substrate and a bias power supply unit connected to the substrate holder in parallel to the RF power unit for supplying a bias voltage to the inside of the vacuum chamber through the substrate holder simultaneously with the power supplied by the RF power unit, and
   a controller wherein the bias power supply unit is adapted to output the bias voltage composed of a negative bias component having a predetermined negative voltage value for a predetermined output time and a pulse bias component corresponding to a pulse output having a positive voltage value for a predetermined time with a cycle set in a range of 1 kHz to 1 GHz, and
   the controller controls the ion plating device so that the ion plating device sequentially performs a preliminary plasma forming process and a film forming process in such a manner that,
   in the preliminary forming process, the vaporizing source does not vaporize the film forming material, the RF power unit does not supply the RF power to the inside of the vacuum chamber, and the bias power supply unit supplies the bias voltage in which an absolute value of the pulse bias component is smaller than an absolute value of the negative bias component to the inside of the vacuum chamber with a cycle set in a range of 1 kHz to 1 GHz, thereby forming the plasma within the vacuum chamber, and
   in the film forming process, the vaporizing source vaporizes the film forming material, the RF power unit supplies the RF power to the inside of the vacuum chamber, and the bias power supply unit supplies the bias voltage to the inside of the vacuum chamber with a cycle set in the range of 1 kHz to 1 GHz, thereby forming the plasma within the vacuum chamber, changing the vaporized film forming material into the plasma, and depositing the film forming material from the plasma on the substrate.

2. The ion plating device according to claim 1, wherein a ratio of the predetermined time of the pulse bias to the cycle of the bias voltage is 40% or less.

3. The ion plating device according to claim 2, wherein the pulse output of the pulse bias is a square wave pulse.

4. The ion plating device according to claim 1, wherein the pulse output of the pulse bias is a square wave pulse.

5. The ion plating device according to any of claims 1 to 3, wherein the bias power supply unit comprises a waveform generator for generating a basic waveform of the bias voltage and a bias power supply for generating the bias voltage having a constant value based on the basic waveform output from the waveform generator.

6. The ion plating device according to any of claims 1 to 3, wherein the bias power supply unit comprises a direct current power supply for forming the negative bias and a pulse power supply for forming the pulse bias.

7. The ion plating device according to any of claims 1 to 3, wherein the bias power supply unit comprises a waveform generator for generating a basic waveform of the bias voltage and a bias power supply for generating the bias voltage having a constant value based on the basic waveform output from the waveform generator, further comprising:
   a radio frequency power supply unit for outputting radio frequency power;
   a high pass filter provided between the radio frequency power supply unit and the substrate holder for passing an output of the radio frequency power supply unit therethrough toward the substrate holder and preventing an output of the bias power supply unit from being input to the radio frequency power supply unit; and
   a first low pass filter provided between the bias power supply unit and the substrate holder for passing an output of the bias power supply unit therethrough toward the substrate holder and preventing an output of the radio frequency power supply unit from being input to the bias power supply unit.

8. The ion plating device according to any of claims 1 to 3, wherein
   the bias power supply unit comprises a direct current power supply for forming the negative bias and an impulse train power supply for forming the pulse bias, further comprising:
   a low pass filter provided between the direct current power supply and the substrate holder, for passing an output of the direct current power supply therethrough toward the substrate holder and preventing an output of the impulse train power supply from being input to the direct current power supply; and
   a band pass filter provided between the impulse train power supply and the substrate holder, for passing an output of the impulse train power supply therethrough toward the substrate holder and preventing an output of the direct current power supply from being input to the impulse train power supply.

9. The ion plating device according to any of claims 1 to 3, wherein the bias power supply unit comprises a direct current power supply for forming the negative bias and a pulse power supply for forming the pulse bias, further comprising:
   a radio frequency power supply unit for outputting radio frequency power;
   a high pass filter provided between the radio frequency power supply unit and the substrate holder for passing an output of the radio frequency power supply unit therethrough toward the substrate holder and preventing an output of the bias power supply unit from being input to the radio frequency power supply unit; and
   a first low pass filter provided between the bias power supply unit and the substrate holder for passing an output of the bias power supply unit therethrough toward the substrate holder and preventing an output of the radio frequency power supply unit from being input to the bias power supply unit.

10. The ion plating device according to any of claims 1 to 3, wherein the bias power supply unit comprises a direct current power supply for forming the negative bias and an impulse train power supply for forming the pulse bias, further comprising:
    a second low pulse filter provided between the direct current power supply and the substrate holder for passing an output of the direct current power supply therethrough toward the substrate holder and preventing an output of the impulse train power supply from being input to the direct current power supply;

a band pass filter provided between the impulse train power supply and the substrate holder for passing an output of the impulse train power supply therethrough toward the substrate holder and preventing an output of the direct current power supply from being input to the impulse train power supply;

a radio frequency power supply unit for outputting radio frequency power; and a high pass filter provided between the radio frequency power supply unit and the substrate holder for passing an output of the radio frequency power supply unit therethrough toward the substrate holder and preventing an output of the bias power supply unit from being input to the radio frequency power supply unit, wherein the second low pass filter is adapted to further prevent an output of the radio frequency power supply unit from being input to the direct current power supply, and the band pass filter is adapted to further prevent an output of the radio frequency power supply unit from begin input to the impulse train power supply.

11. The ion plating device according to any of claims 1 to 3, wherein the bias power supply unit comprises a waveform generator for generating a basic waveform of the bias voltage and a bias power supply for generating the bias voltage having a constant value based on the basic waveform output from the waveform generator, further comprising:

a radio frequency power supply unit for outputting radio frequency power;

a high pass filter provided between the radio frequency power supply Unit and the substrate holder for passing an output of the radio frequency power supply unit therethrough toward the substrate holder and preventing an output of the bias power supply unit from being input to the radio frequency power supply unit; and a first low pass filter provided between the bias power supply unit and the substrate holder for passing an output of the bias power supply unit therethrough toward the substrate holder and preventing an output of the radio frequency power supply unit from being input to the bias power supply unit.

12. The ion plating device according to any of claims 1 to 3, wherein the bias power supply unit comprises a direct current power supply for forming the negative bias and a pulse power supply for forming the pulse bias, further comprising:

a radio frequency power supply unit for outputting radio frequency power;

a high pass filter provided between the radio frequency power supply unit and the substrate holder for passing an output of the radio frequency power supply unit therethrough toward the substrate holder and preventing an output of the bias power supply unit from being input to the radio frequency power supply unit; and a first low pass filter provided between the bias power supply unit and the substrate holder for passing an output of the bias power supply unit therethrough toward the substrate holder and preventing an output of the radio frequency power supply unit from being input to the bias power supply unit, wherein a preliminary plasma forming process is adapted to be carried out in such a manner that the vacuum chamber is evacuated to a state of $6.7 \times 10^{-3}$ Pa to $6.7 \times 10^{-1}$ Pa, and the bias voltage in which an absolute value of the pulse bias component is smaller than an absolute value of the negative bias component is output with a cycle set in a range of 1 kHz to 1 GHz to generate a preliminary plasma and then, a film forming process is adapted to be carried out in such a manner that the vacuum chamber is evacuated to a state in which the material of the film can be vaporized to generate a plasma for film formation and the radio frequency power as well as the bias voltage is output to generate the plasma for film formation, thereby forming the film on the substrate.

13. The ion plating device according to any of claims 1 to 3, wherein the bias power supply unit comprises a direct current power supply for forming the negative bias and an impulse train power supply for forming the pulse bias, further comprising:

a second low pulse filter provided between the direct current power supply and the substrate holder, for passing an output of the direct current power supply therethrough toward the substrate holder and preventing an output of the impulse train power supply from being input to the direct current power supply;

a band pass filter provided between the impulse train power supply and the substrate holder, for passing an output of the impulse train power supply therethrough toward the substrate holder and preventing an output of the direct current power supply from being input to the impulse train power supply;

a radio frequency power supply unit for outputting radio frequency power;

a high pass filter provided between the radio frequency power supply unit and the substrate holder, for passing an output of the radio frequency power supply unit therethrough toward the substrate holder and preventing an output of the bias power supply unit from being input to the radio frequency power supply unit, wherein the second low pass filter is adapted to further prevent an output of the radio frequency power supply unit from being input to the direct current power supply, the band pass filter is adapted to further prevent an output of the radio frequency power supply unit from begin input to the impulse train power supply, a preliminary plasma forming process is adapted to be carried out in such a manner that the vacuum chamber is evacuated to a state of $6.7 \times 10^{-3}$ Pa to $6.7 \times 10^{-1}$ Pa and the bias voltage in which an absolute value of the pulse bias component is smaller than an absolute value of the negative bias component is output with a cycle set in a range of 1 kHz–1 GHz to generate a preliminary plasma and then, a film forming process is adapted to be carried out in such a manner that the vacuum chamber is evacuated to a state in which the material of the film can be vaporized to generate a plasma for film formation and the radio frequency power as well as the bias voltage is output to generate the plasma for film formation, thereby forming the film on the substrate.

14. The ion plating device according to claim 1, wherein the bias power supply unit outputs the pulse bias voltage with a cycle set in a range of 100 kHz to 500 kHz.

15. An ion plating device comprising:

a vacuum chamber adapted to be evacuated;

a substrate holder placed in the vacuum chamber for holding a substrate;

a vaporizing source for vaporizing a film forming material to be formed on the substrate within the vacuum chamber;

a power supply unit including an RF power unit connected to the substrate holder for supplying RF power to an inside of the vacuum chamber through the substrate holder for changing the vaporized film forming material into a plasma and for depositing the film forming material from the plasma on the substrate and a bias power supply unit connected to the substrate holder in parallel to the RF power unit for supplying a bias voltage to the inside of the vacuum chamber through the substrate holder simultaneously with the power supplied by the RF power unit, and a controller wherein the bias power supply unit is adapted to output the bias voltage composed of a negative bias component having a predetermined negative voltage value for a predetermined output time and a pulse bias component corresponding to a pulse output having a positive voltage value for a predetermined time with a cycle set in a range of 1 kHz to 1 GHz, and wherein a ratio of the predetermined time of the pulse bias to the cycle of the bias voltage is 40% or less and the controller controls the ion plating device so that the ion plating device sequentially performs a preliminary plasma forming process and a film forming process in such a manner that, in the preliminary forming process, the vaporizing source does not vaporize the film forming material, the RF power unit does not supply the RF power to the inside of the vacuum chamber, and the bias power supply unit supplies the bias voltage in which an absolute value of the pulse bias component is smaller than an absolute value of the negative bias component to the inside of the vacuum chamber with a cycle set in a range of 1 kHz to 1 GHz, thereby forming the plasma within the vacuum chamber, and in the film forming process, the vaporizing source vaporizes the film forming material, the RF power unit supplies the RF power to the inside of the vacuum chamber, and the bias power supply unit supplies the bias voltage to the inside of the vacuum chamber with a cycle set in the range of 1 kHz to 1 GHz, thereby forming the plasma within the vacuum chamber, changing the vaporized film forming material into the plasma, and depositing the film forming material from the plasma on the substrate.

* * * * *

UNITED STATES PATENT AND TRADEMARK OFFICE
CERTIFICATE OF CORRECTION

PATENT NO. : 6,863,018 B2
DATED : March 8, 2005
INVENTOR(S) : Yasuhiro Koizumi et al.

It is certified that error appears in the above-identified patent and that said Letters Patent is hereby corrected as shown below:

Column 12,
Line 66, after "a second low" please delete "pulse" and insert -- pass -- in its place.

Column 13,
Line 37, after "power supply" please delete "Unit" and insert -- unit -- in its place.

Column 14,
Line 21, after "a second low" please delete "pulse" and insert -- pass -- in its place.

Signed and Sealed this

Twenty-ninth Day of November, 2005

JON W. DUDAS
*Director of the United States Patent and Trademark Office*